(12) United States Patent
Gaines et al.

(10) Patent No.: US 6,454,276 B2
(45) Date of Patent: *Sep. 24, 2002

(54) CORROSION RESISTANT GASKET FOR AIRCRAFT

(75) Inventors: Patrick W. Gaines, Auburn; Mickey A. Williamson, Seattle, both of WA (US)

(73) Assignee: The Boeing Company, Seattle, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/268,457

(22) Filed: Mar. 16, 1999

Related U.S. Application Data

(60) Division of application No. 08/861,179, filed on May 21, 1997, now abandoned, which is a continuation-in-part of application No. 08/602,550, filed on Feb. 20, 1996, now abandoned, which is a continuation-in-part of application No. 08/356,983, filed on Dec. 16, 1994, now abandoned, which is a continuation-in-part of application No. 08/233,869, filed on Apr. 26, 1994, now abandoned, which is a continuation-in-part of application No. 07/932,098, filed on Aug. 19, 1992, now abandoned.

(51) Int. Cl.[7] ................................................. F16J 15/12
(52) U.S. Cl. ....................... 277/650; 277/651; 277/904; 277/920
(58) Field of Search ................................. 277/628, 630, 277/634, 650, 651, 652, 904, 920; 174/35 GC, 35 MS

(56) References Cited

U.S. PATENT DOCUMENTS

| | | | | |
|---|---|---|---|---|
| 2,477,267 | A | * | 7/1949 | Robinson |
| 3,206,536 | A | * | 9/1965 | Goodloe |
| 3,740,062 | A | * | 6/1973 | Robins |
| 3,843,764 | A | * | 10/1974 | Grawey et al. |
| 4,037,009 | A | * | 7/1977 | Severinsen |
| 4,134,119 | A | | 1/1979 | Sandoz |
| 4,579,248 | A | * | 4/1986 | Gorges |
| 4,678,699 | A | * | 7/1987 | Kritchevsky et al. |
| 4,678,716 | A | * | 7/1987 | Tzeng |
| 4,778,950 | A | * | 10/1988 | Lee et al. |
| 4,900,877 | A | * | 2/1990 | Dubrow et al. |
| 5,045,635 | A | * | 9/1991 | Kaplo et al. |
| 5,074,152 | A | * | 12/1991 | Ellner et al. |
| 5,294,270 | A | * | 3/1994 | Fenical |

FOREIGN PATENT DOCUMENTS

| | | | |
|---|---|---|---|
| GB | 810814 | * | 3/1959 |
| WO | WO 94/28337 | * | 12/1994 |

* cited by examiner

*Primary Examiner*—Anthony Knight
*Assistant Examiner*—John L. Beres
(74) *Attorney, Agent, or Firm*—Conrad O. Gardner

(57) ABSTRACT

A corrosion resistant gasket for aircraft, and more particularly to encapsulation of a conductive mesh in a pliable fluorosilicone compound that will not become bonded to mating surfaces and will also migrate upon compression during installation to the threads of attaching hardware utilized between the instrument, antenna, and aircraft structure, thereby reducing corrosion through the attaching hardware, by providing a hermetic seal around the periphery of the envelope of the attached device.

5 Claims, 3 Drawing Sheets

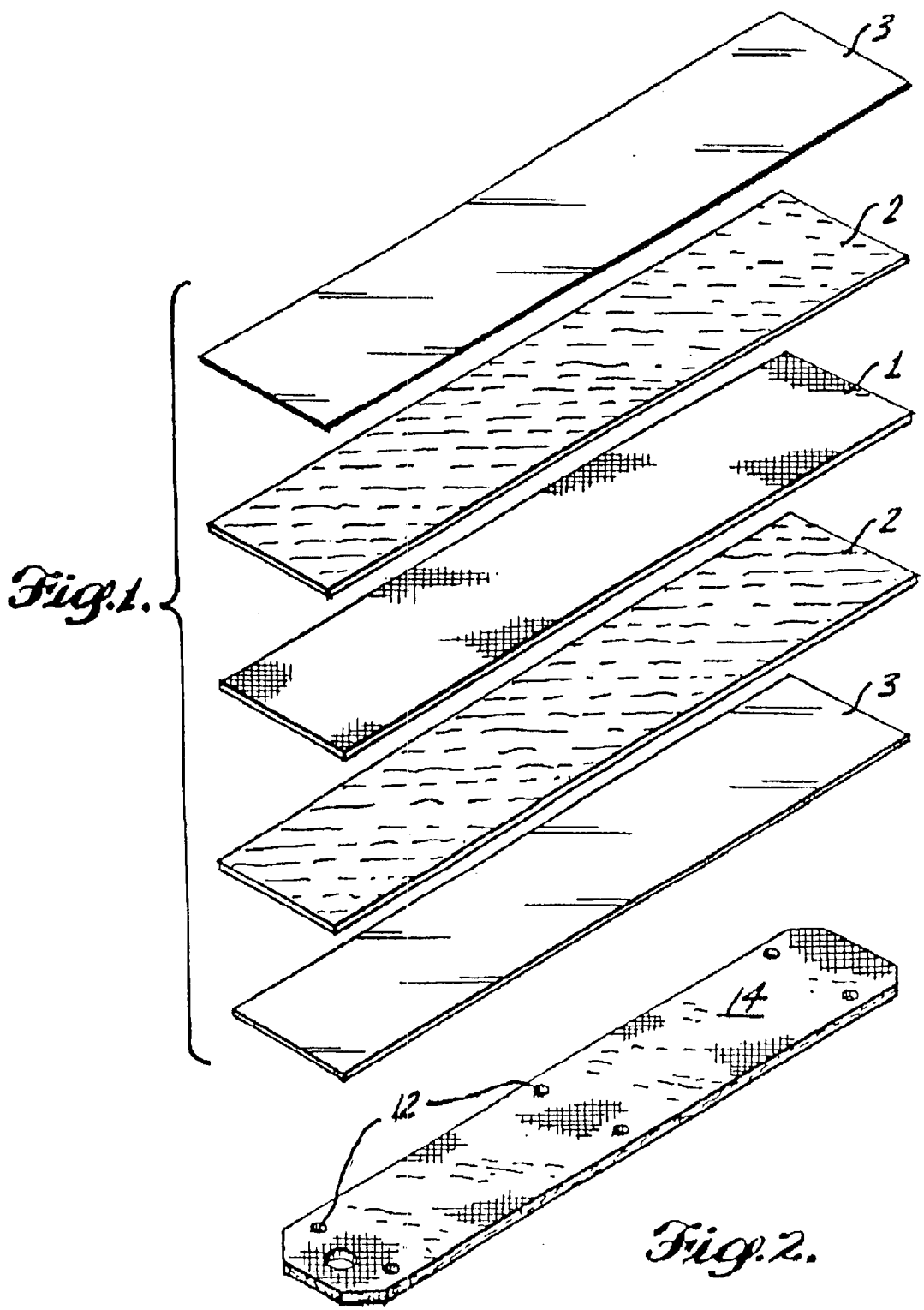

CORROSION RESISTANT GASKET FOR AIRCRAFT

RELATED APPLICATIONS

This is a divisional application of continuation-in-part application Ser. No. 08/861,179 filed May 21, 1997, now abandoned, which is a continuation-in-part of application Ser. No. 08/602,550, filed Feb. 20, 1996, abandoned, which is a continuation-in-part of application, Ser. No. 08/356,983 filed Dec. 16, 1994, abandoned, which is a continuation-in-part of application, Ser. No. 08/233,869 filed Apr. 26, 1994, abandoned, which is a continuation-in-part of application Ser. No. 07/932,098 filed Aug. 19, 1992, abandoned.

BACKGROUND OF THE INVENTION

This invention relates to a corrosion resistant gasket for aircraft, and more particularly to encapsulation of a conductive mesh in a pliable uncured, uncatalyzed fluorosilicone compound having a durometer of 40 or less that will not become bonded to mating surfaces and will also migrate upon compression during installation to the threads of attaching hardware utilized between the instrument, antenna, and aircraft structure, thereby reducing corrosion through the attaching hardware, by providing an outer bead around the periphery of the envelope to provide a hermetic seal of the attached device.

Present methods of providing coupling between mating surfaces in aircraft having aluminum structures were limited to the uses of cured elastomer gaskets, metallic gaskets using sealants, or a multiple use of corrosion inhibitors and plating. The cured elastomer gaskets would allow moisture between the mating surfaces and tended to become bonded/adhere or retain a memory under compression to the two surfaces after a period of time and temperature cycling. The metallic gaskets also had a permanent bonding problem due to the application of adhesives to reduce the moisture ingress between the two surfaces. Both elastomer and metallic gaskets tended to shift the frequency of antenna installations due to the gap they created between the two mating surfaces, causing a shift in the VSWR of the antenna. The use of the corrosion resistant compounds and sealants creates a time consuming process in application and removal and tend to crack during structure flexing, thereby allowing moisture to ingress between the mating surfaces and causing a breakdown of the inhibitors.

Also, most gaskets presently used have a base material so dissimilar to aluminum that they thereby cause galvanic corrosion, rather than prevent it, due to the fact that they cannot provide a hermetic seal by themselves and require the use of an outside sealant which when used in high vibration areas or under flexing conditions tends to crack and thereby introduces an electrolyte that creates a galvanic cell.

Other alloy meshes such as Monel, a nickel plated copper alloy manufactured by The Chomerics Co. of Woburn, Mass., embedded in silicone gels are dissimilar metals with respect to aircraft structure or aircraft antenna base, such that they are subject to corrosion themselves or cause additional corrosion through galvanic corrosion when exposed to certain unfavorable environments. Also, it has been proven, both by lab tests and in service applications, that the use of silicone on aircraft in areas where the silicone is either exposed to jet fuel or jet fuel vapors, the silicone deteriorates and consequently the corrosion protection is jeopardized in the use of aircraft applications.

SUMMARY OF THE INVENTION

The present invention provides a gasket which prevents the ingress of moisture and or other contaminates between the surfaces of aluminum causing corrosion or galvanic corrosion in this area. The gasket is constructed so that it eliminates present electrical bonding methods through the attaching screws and provides a positive bond through the structure to the base of the instrument, antenna, and/or aircraft skin lap joints, electrical receptacle outlets, waste outlets, lavatory installations and galley installations. Besides providing electrical bonding through surface to surface contact, eliminating all aspects of corrosion, the gasket is capable of reducing corrosion through the attaching hardware by migrating the insulating properties of the uncured unvulcanized fluorosilicone material of the gasket onto the threads of the attaching hardware and forms an outer bead of the fluorosilicone compound around the periphery of the installation upon compression. Although the gasket is shown in certain illustrative embodiments herein in aircraft applications, it is also useful in marine applications where salt water corrodes aluminum or steel installations and where maintaining electrically conductive properties between mating surfaces is a serious problem.

By using the present flexible gasket comprising silver-plated stranded aluminum when low electrical bonding resistance is required in certain aircraft installations requiring less than 0.02 milliohm encapsulated in an uncured unvulcanized fluorosilicone, application time is reduced, as well as removal and elimination of structural and component damage during removal. Since the fluorosilicone compound provides a hermetic seal under high vibration, flexing conditions, aerodynamic conditions of up to 0.8 Mach, and provides a seal for internal aircraft pressure of over 30 P.S.I., there is no fear of an introduction of either an outside, or inside introduction of an electrolyte that would create a galvanic cell. For the purposes of cost reductions in applications that do not require extremely low bonding resistance requirements, and only need to be less than 1 milliohm, then the aluminum woven metallic mesh or expanded aluminum screen can be of the same surface structure type currently used in the manufacture of aircraft structures. The expanded aluminum screen is favored over the metallic woven mesh for airplane applications. The reason for the preference of the expanded aluminum screen for airplane applications is the pliability of the expanded aluminum which is made from an expanded metal foil is one of several mesh (or open area) materials used in eliminating interference. It is made from solid foil gauge metals to precision tolerances. The process involves a shaped tool lancing and stretching a ductile metal in one motion. The resulting holes are diamond-shaped with a large variety of hole sizes. Dimensions range from a $\frac{1}{32}$" in the long way of the diamond (LWD) to approximately $\frac{1}{2}$" LWD. In shielding applications an LWD of $\frac{1}{8}$" or less is most common, although different shape holes can also be created. Material options include selvage edge, solid sections and annealing. Upon compression the screen will make contact with the two mating surfaces to provide electrical continuity, but will not cause any pits into the airplane structure as will the woven metallic mesh with the harder durometer. This has been observed on in-service airline field tests and discovered after a period of two years with periodic inspections using the woven metallic mesh.

By encapsulating the woven mesh or expanded aluminum screen with a fluorosilicone compound such as Dow Corning LS40 or GE FSE2120, or any other fluorosilicone compound that is not vulcanized and catalyzed the end product can be achieved. The fluorosilicone compound is best applied in a sheet form to a precut or die cut configuration of the metallic mesh or screen the configuration of the device to be applied to. The expanded aluminum screen should not exceed more than 20% of the thickness of the fluorosilicone compound. Application of the compound to the mesh can be accomplished by placing a layer of the compound on a warm pad and placing the aluminum screen or mesh on top. Then by the use of a vacuum bag, cover the heated gasket and drawing vacuum, the fluorosilicone compound will flow through the mesh, and also fill all the installation cut-outs for the attaching screws.

FIG. 8 shows a gasket that has an inner elastomer in the die cut for the attaching hardware that provides corrosion protection to the screws and nut plates or fasteners. FIG. 8 shows the use of two layers of the screen or expanded aluminum mesh of FIG. 7 and die cut of the same to the desired configuration and the insertion of the uncured elastomer between the two conductive layers. This eliminates the need for special type release liners and can be packaged for application in any type of plastic or paper container. When applied under pressure the two aluminum mesh 32 meet and form the electrical contact needed between the two mating surfaces and the elastomer 31 squeezed between the openings and outer periphery of the exposed mesh to encapsulate the mesh and provide a hermetic seal. The desired thickness of elastomer 31 is approximately 0.20 inch and having a thickness of 0.008 inch with the expanded height of the mesh being 0.016 inch. Depending upon the depth of the groove or channel, the described initial buildup can be multiple layers to form any particular height. At the same time that the squeegee action of the elastomer is taking place, if there is any moisture on either of the mating surfaces, it is expelled by the application of the elastomer.

The present gasket provides a hermetic seal between two mating surfaces and provides corrosion protection between those surfaces that the pliable material is in contact with, including attaching hardware when the compound is migrated to the threads during installation. The internal mesh or screen provides a positive electrical bond to reduce lightning strike and improve antenna performance such as eliminating "P" static build up when under compression of the base and structure.

In contrast to the material described e.g. in U.S. Pat. No. 4,900,877, the insulating material must be made from a fluorosilicone material that may be made from a commercial colloidal substance or from a thixotropic fluorosilicone material that is uncatalyzed, unvulcanized, has no water containment in it's make up, and free from bubbles and voids so as to provide a hermetic seal from the outside environment as well as to contain internal aircraft contaminates from migrating from the connector orifice to the outer edge of the instrument or antenna that the gasket is mated between. Silicone or fluorosilicone gels have a certain amount of water in their makeup. This is an undesirable feature that causes internal corrosion by providing an electrolyte between the mesh and structures when the gel is displaced under compression. This has been proven during extensive in-service airplane field tests. The other noted undesirable effect was the migration of the gel and internal silicone oils to the outer surrounding surface under compression. This silicone contamination then reduces good paint adhesion. The conductive mesh or screen must also have a minimum hole opening of 0.065 inch with a minimum of 8 holes per inch with the X monofilament dimension height to be twice that of the Y dimension width so as to provide pliable conformity to the aircraft contour and provide surface contact to the mating surfaces at fifteen inch pounds of compression. The conductive material must also be of a low resistance so as to provide the integrity needed for system performance and against the hazards encountered with lightning strike. This precludes the use of any type of material that is identified as E.M.I. shielding material, since these types of materials consist of higher resistive materials such as Monel that provide against high frequency penetration or High Intensity Radiated fields (H.I.R.F.) protection.

With the present gasket, application time is minimal and removal time is equal to the application time, and further, structural and component damage is eliminated during removal.

The present gasket further protects the installation in harsh environments of aircraft fluids, altitude immersions to 75,000 feet, vibration, structural flexing, and temperatures of −65° to 450° F.

DESCRIPTION OF THE DRAWINGS

The invention will now be described with reference to embodiments thereof shown for purpoes of illustration in the accompanying drawings wherein:

FIG. 1 an exploded view of the layup of layers of a sandwich structure used to form different geometry gaskets;

FIG. 2 gasket having a geometry suitable for a marker beacon antenna subsequent to assembly and die cutting of the sandwich structure layup of FIG. 1:

DESCRIPTION OF THE ILLUSTRATED EMBODIMENTS

Figure 3:
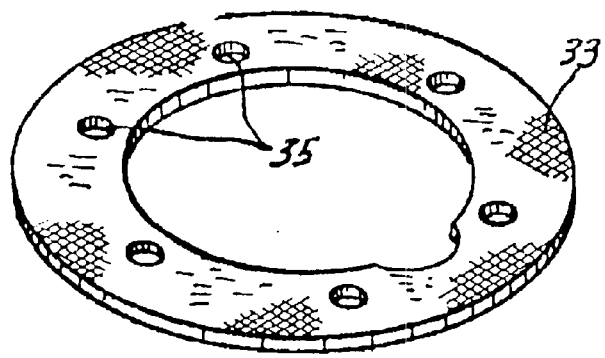
FIG. 3 is an alternative die cutting of the sandwich structure layup of FIG. 1 having a geometry suitable for an instrument gasket for mounting a total air temperature instrument to an aircraft structure mating surface.

Turning now to FIG. 1, wherein an aluminum monofilament is woven into a mesh or knot electrically conductive structure 1 which is seen to be positioned intermediate adjacent layers of compressible fluorosilicone compound 2; electrically conductive structure 1 and adjacent layers of compressible fluorosilicone compound 2 are then seen to be further sandwiched between liners 3 applied to each side of the outer surfaces of layers of compressible fluorosilicone compound 2 to protect layers and the fluorosilicone compound 2 mesh 1 structure against contaminants prior to use. The layers 1, 2, and 3 of the sandwich assembly of FIG. 1 are assembled together and die cut out into the geometry of an antenna gasket 14, as shown in FIG. 2. A plurality of holes 12 are suitable positioned in antenna gasket 14 for attaching hardware 22 utilized to attach the antenna 20 (seen in FIG. 6) to the aluminum aircraft skin surface 30.

Gasket 33, of FIG. 3 is die cut from the sandwich assembly layup of FIG. 1 to a geometry suitable for mounting an aircraft instrument to aircraft structure. Gasket 33 includes suitable holes 35 for mounting hardware (not shown) for fastening the instrument down on gasket 33 to the aircraft structure (not shown).

Figure 4:
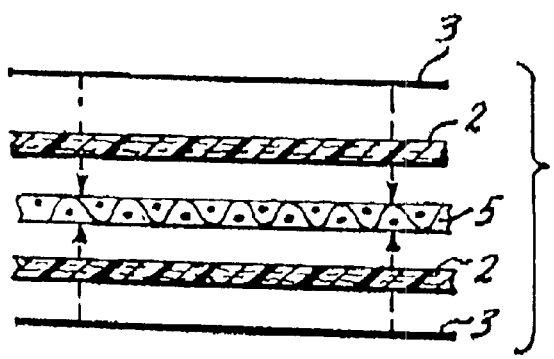
FIG. 4 is an exploded view of a gasket layup according to FIG. 1, utilizing a mesh in the sandwich structure.
Figure 5:
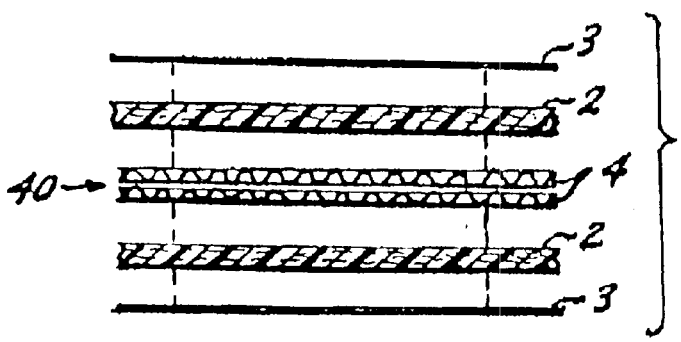
FIG 5 is an exploded view of a gasket layup according to FIG. 1, utilizing a knit in the sandwich structure.
Figure 6:
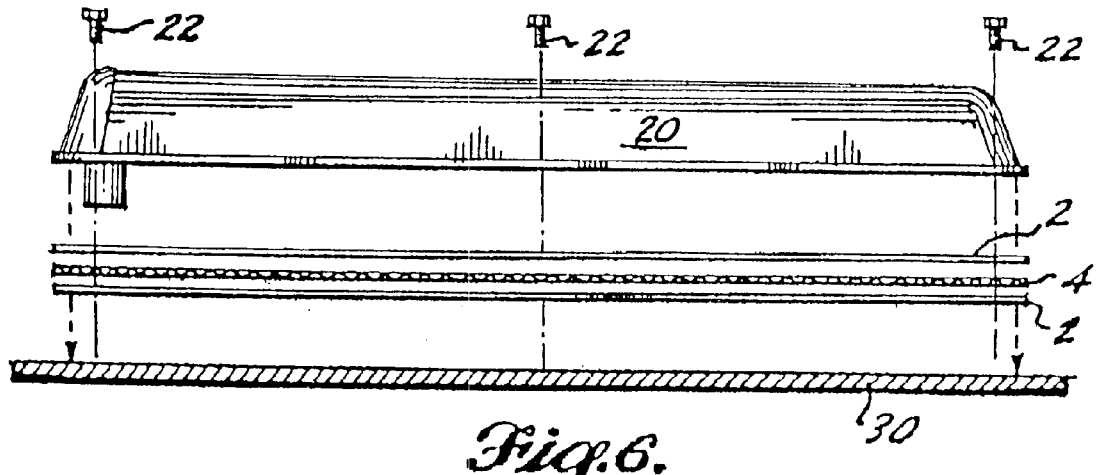
FIG. 6 is illustrative of the method of assembly of an aircraft antenna to an aluminum outer surface aircraft skin subsequent to removal of release liners from the layup of FIG. 5 and prig to compression of the aircraft antenna to the aircraft surface.

Release liners 3 of FIGS. 1, 4, and 5 is of the type used to protect adhesive transfer on labels. Mesh 5 of the sandwich layup of FIG. 4 is a tight weave, 0.003 in. of larger, plated with a 0.001 inch silver metal on a 0.003 mil. aluminum monofilament. In the sandwich layup of FIG. 5, instead of a mesh 4, as in FIG. 4, a knit in the form of a sock 4 is utilized, so that a spacer or non-conductive material can be inserted as shown at 40 between the outer surfaces of sock 4, so that as to make the inserted spacer or non-conductive material conductive and at the same time prevent corrosion between two adjoining parts.

Where a weave sock 4 includes therewithin a non-conductive spacer inserted at 40 between the sides of weave sock 4 and utilized in the gasket assembly of FIG. 6 for fastening antenna 20 down to aluminum aircraft skin surface 30, a conductive corrosion-proof gasket results which eliminates the previous dielectric spacer effect that reduced antenna performance, thereby providing an electrically conductive bonding between the two mating surfaces.

Prior to compression of the gasket assembly of 6 by tightening down of mounting hardware 22 upon aircraft antenna 20 to aluminum aircraft skin surface 30, protective release liners 3 (shown in FIG. 5) are removed, and in the compression step, fluorosilicone compound layers 2 are compressed to result in a gasket having a thickness of the center conductive woven silver-plated aluminum monofilament structure of between about 0.31 and 0.010 inches. The present gaskets eliminate any electrolyte between two mating components after compression and achieve one electrical bond between the two mating surfaces. Since the gasket provides a hermetic seal by itself, the need for additional sealants commonly used by other types is not required with the fluorosilicone compound or thixotropic gasket with a conductive inner mesh.

Figure 7:
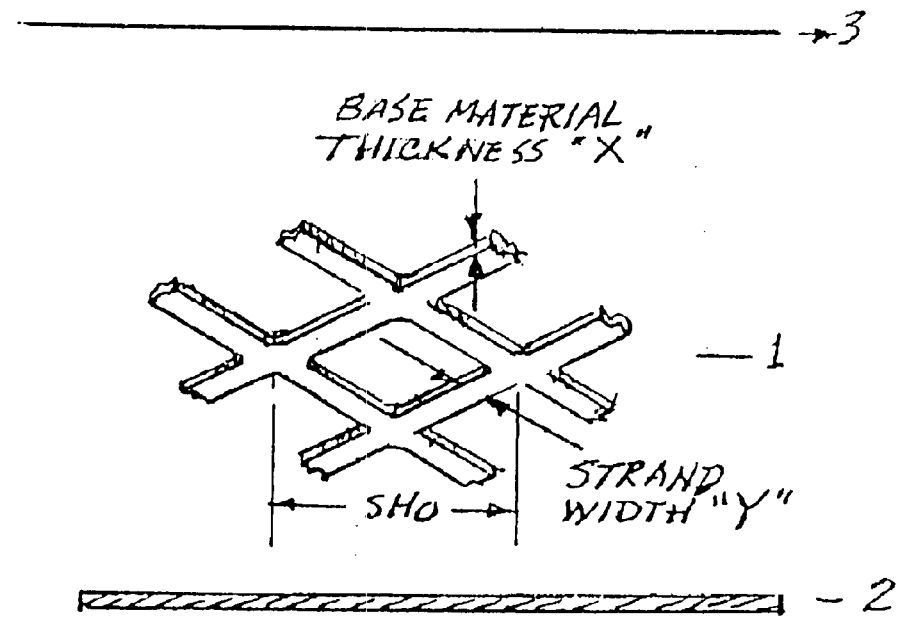
FIG 7. is illustrative of an expanded aluminum mesh showing strand hole opening.

FIG. 7 shows the expanded aluminum mesh with the base material thickness, height or "X" dimension and the strand width or "Y" dimension in the expanded form to show the strand hole opening, or "SHO" of the electrically conductive material 1 also known as the long way of the diamond (LWD) in commercial applications; with the fluorosilicone compound 2; being sandwiched together with the liner 3.

Figure 8:
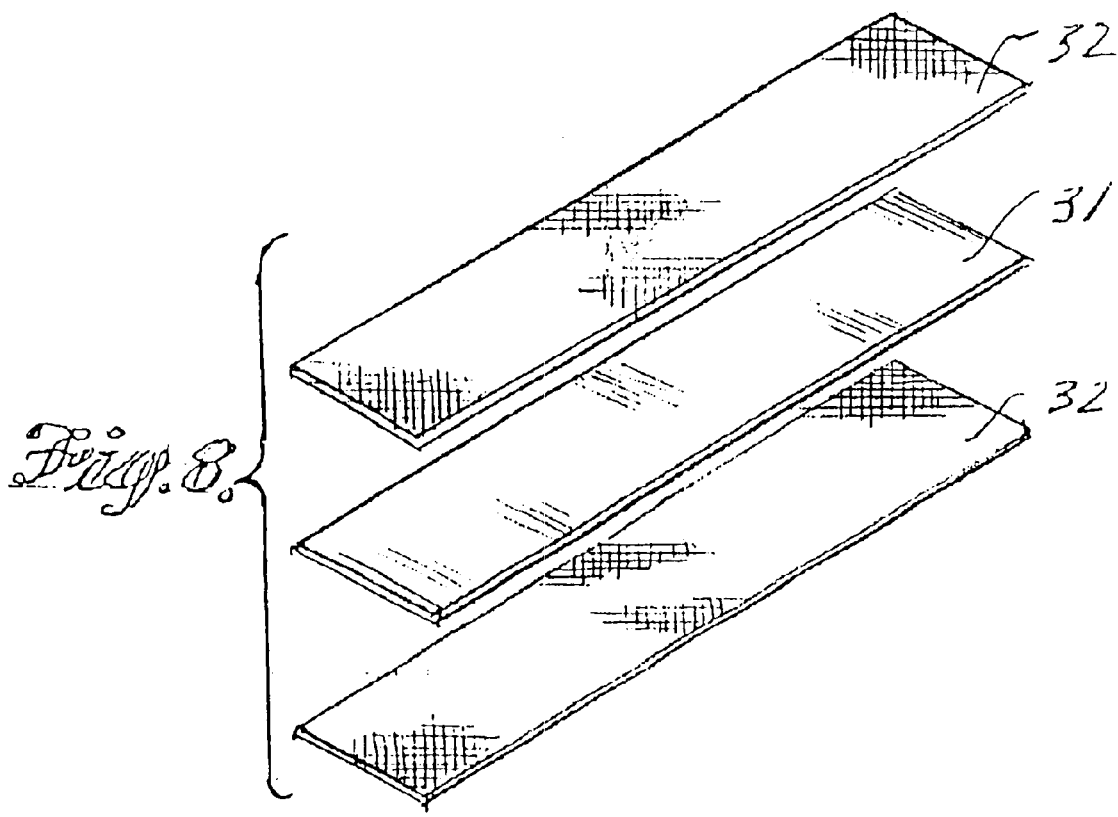
FIG. 8 illustrative of a further embodiment of the invention where an uncured elastomer is inserted between two conductive layers.

FIG. 8 as hereinbefore described is similar to the embodiment of FIG. 7 with the deletion of the liner and the addition of a further aluminum mesh.

What is claimed is:

1. In combination:
   an instrument;
   aircraft structure;
   attaching hardware utilized between said instrument and said aircraft structure and, a corrosion resistant gasket disposed between said instrument and said aircraft structure; and,
   said corrosion resistant gasket comprising a conductive mesh encapsulated in a pliable uncured uncatalyzed fluorosilicone compound having a durometer of 40 or less that will not become bonded to mating surfaces and will also migrate upon compression during installation to the threads of said attaching hardware thereby reducing corrosion through the attaching hardware by providing an outer bead around the periphery of the envelope to provide a hermetic seal of the attached instrument.

2. The combination of claim 1 wherein said instrument comprises an antenna.

3. In combination in a gasket:
   an expanded aluminum screen encapsulated with a fluorosilicone compound that is not vulcanized and catalyzed; and
   said expanded aluminum screen not exceeding more than 20% of the thickness of said fluorosilicone compound.

4. In combination:
   an aircraft antenna;
   an aircraft structure;
   a gasket disposed between said aircraft antenna and said aircraft structure; and
   said gasket including an uncured in catalyzed fluorosilicone material encapsulating a conductive mesh, said mesh having a minimum hole opening of 0.065 inches with a minimum of eight holes per inch with the X monofilament dimension height twice that of the Y dimension width so as to provide pliable conformity to the aircraft structure contour and surface contact to the mating surfaces at fifteen inch pounds of compression.

5. A flexible gasket comprising silver plated stranded aluminum having low electrical bonding resistance of less than 0.02 milliohm encapsulated in an uncured unvulcanized fluorosilicone compound thereby eliminating structural and component damage during removal, said uncured, unvulcanized fluorosilicone compound providing a hermetic seal under high vibration, flexing conditions, and aerodynamic conditions of up to 0.6 mach, said uncured unvulacnized fluorosilicone compound further providing a seal for internal aircraft pressure over 30 p.s.i. thereby preventing either outside or inside introduction of an electrolyte creating a galvanic cell.

\* \* \* \* \*